US006399459B2

(12) United States Patent
Al-Shareef et al.

(10) Patent No.: US 6,399,459 B2
(45) Date of Patent: Jun. 4, 2002

(54) DOUBLE LAYER ELECTRODE AND BARRIER SYSTEM ON HEMISPHERICAL GRAIN SILICON FOR USE WITH HIGH DIELECTRIC CONSTANT MATERIALS AND METHODS FOR FABRICATING THE SAME

(75) Inventors: Husam N. Al-Shareef, Amman (JO); Scott DeBoer, Boise, ID (US); Randhir Thakur, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/892,594

(22) Filed: Jun. 27, 2001

Related U.S. Application Data

(62) Division of application No. 09/386,833, filed on Aug. 31, 1999, now Pat. No. 6,281,543.

(51) Int. Cl.[7] .............................................. H01L 21/20
(52) U.S. Cl. ..................... 438/398; 438/240; 438/255; 438/381
(58) Field of Search ................................ 438/240, 255, 438/398, 381

(56) References Cited

U.S. PATENT DOCUMENTS

| | | |
|---|---|---|
| 4,309,295 A | 1/1982 | McSweeney |
| 4,784,973 A | 11/1988 | Stevens et al. |
| 4,811,078 A | 3/1989 | Tigelaar et al. |
| 4,956,683 A | 9/1990 | Quintana |
| 5,061,650 A | 10/1991 | Dennison et al. |
| 5,278,091 A | 1/1994 | Fazan et al. |
| 5,292,677 A | 3/1994 | Dennison |
| 5,340,763 A | 8/1994 | Dennison |
| 5,340,765 A | 8/1994 | Dennison et al. |
| 5,362,666 A | 11/1994 | Dennison |
| 5,407,534 A | 4/1995 | Thakur |
| 5,457,063 A | 10/1995 | Park |
| 5,459,094 A | 10/1995 | Jun |
| 5,491,356 A | 2/1996 | Dennison et al. |
| 5,508,223 A | 4/1996 | Tseng |
| 5,554,866 A | 9/1996 | Nishioka et al. |
| 5,581,436 A | 12/1996 | Summerfelt et al. |
| 5,608,247 A | 3/1997 | Brown |
| 5,619,393 A | 4/1997 | Summerfelt et al. |
| 5,652,464 A | 7/1997 | Liao et al. |
| 5,665,628 A | 9/1997 | Summerfelt |
| 5,679,980 A | 10/1997 | Summerfelt |
| 5,695,815 A | 12/1997 | Vaartstra |
| 5,754,390 A | 5/1998 | Sandhu et al. |

(List continued on next page.)

FOREIGN PATENT DOCUMENTS

| | | |
|---|---|---|
| EP | 874393 A2 | 10/1998 |
| EP | 924752 A2 | 6/1999 |

*Primary Examiner*—Trung Dang
(74) *Attorney, Agent, or Firm*—TraskBritt

(57) ABSTRACT

A high surface area capacitor comprising a double metal layer (an electrode metal and barrier material) deposited on hemispherical grain (HSG) silicon, wherein a high dielectric constant (HDC) material is deposited over the double metal layer. The high surface area capacitor is complete with an upper cell plate electrode deposited over the HDC material. The double metal layer preferably comprises one noble metal, such as platinum or palladium, for the electrode metal and an oxidizable metal, such as ruthenium, iridium, or molybdenum, for the barrier material. The noble metal, such as platinum metal, alone would normally allow oxygen to diffuse into and oxidize any adhesion layer (making the adhesion layer less conductive) and/or undesirably oxidize any silicon-containing material during the deposition of the HDC material. Thus, the barrier metal is used to form a conducting oxide layer or a conducting layer which stops the oxygen diffusion. The HSG polysilicon provides an enhanced surface roughness that boosts cell capacitance. The HDC material, preferably BST or the like, is also used to boost cell capacitance.

9 Claims, 7 Drawing Sheets

U.S. PATENT DOCUMENTS

| | | |
|---|---|---|
| 5,759,262 A | 6/1998 | Weimer et al. |
| 5,956,595 A | 9/1999 | Zenke |
| 6,004,857 A | 12/1999 | Hsiao et al. |
| 6,175,129 B1 | 1/2001 | Liu et al. |
| 6,218,260 B1 * | 4/2001 | Lee et al. .................... 438/398 |
| 6,238,994 B1 * | 5/2001 | Derderian ................... 438/398 |
| 6,291,289 B2 * | 9/2001 | Rhodes et al. .............. 438/239 |

* cited by examiner

DOUBLE LAYER ELECTRODE AND BARRIER SYSTEM ON HEMISPHERICAL GRAIN SILICON FOR USE WITH HIGH DIELECTRIC CONSTANT MATERIALS AND METHODS FOR FABRICATING THE SAME

CROSS-REFERENCE TO RELATED APPLICATION

This application is a divisional of U.S. patent application Ser. No. 09/386,833, filed Aug. 31, 1999, now U.S. Pat. No. 6,281,543 B1 issued Aug. 28, 2001.

BACKGROUND OF THE INVENTION

1. Field of the Invention

The present invention relates to a semiconductor memory device and method of fabricating same. More particularly, the present invention relates to capacitor fabrication techniques applicable to dynamic random access memories ("DRAMs") utilizing high dielectric constant ("HDC") materials with hemispherical grain ("HSG") silicon and utilizing a double layer electrode having a useful barrier system during the fabrication of the same.

2. State of the Art

A widely utilized DRAM (Dynamic Random Access Memory) manufacturing process utilizes MOS (Metal Oxide Semiconductor) technology to produce DRAM circuits which comprise an array of unit memory cells, each including one capacitor and one transistor, such as a field effect transistor ("FET"). In the most common circuit designs, one side of the transistor is connected to external circuit lines called the bit line and the word line, and the other side of the capacitor is connected to a reference voltage that is typically one-half the internal circuit voltage. In such memory cells, an electrical signal charge is stored in a storage node of the capacitor connected to the transistor which charges and discharges circuit lines of the capacitor.

Higher performance, lower cost, increased miniaturization of components, and greater packaging density of integrated circuits are ongoing goals of the computer industry. The advantages of increased miniaturization of components include: reduced-bulk electronic equipment, improved reliability by reducing the number of solder or plug connections, lower assembly and packaging costs, and improved circuit performance. In pursuit of increased miniaturization, DRAM chips have been continually redesigned to achieve ever higher degrees of integration which has reduced the size of the DRAM. However, as the dimensions of the DRAM are reduced, the occupation area of each unit memory cell of the DRAM must be reduced. This reduction in occupied area necessarily results in a reduction of the dimensions of the capacitor, which, in turn, makes it difficult to ensure required storage capacitance for transmitting a desired signal without malfunction. However, the ability to densely pack the unit memory cells while maintaining required capacitance levels is a crucial requirement of semiconductor manufacturing technologies if future generations of DRAM devices are to be successfully manufactured.

In addition to the need for smaller components, there has also been a growing demand for devices having lower power consumption. In the manufacture of transistors, these trends have led the industry to refine approaches to achieve thinner cell dielectric and conductive layers. These trends have also added to the difficulty of ensuring storage capacitance for transmitting a desired signal without malfunction.

In order to minimize such a decrease in storage capacitance caused by the reduced occupied area of the capacitor, the capacitor should have a relatively large surface area within the limited region defined on a semiconductor substrate. The drive to produce smaller DRAM circuits has given rise to a great deal of capacitor development. However, for reasons of available capacitance, reliability, and ease of fabrication, most capacitors are stacked capacitors in which the capacitor covers nearly the entire area of a cell and in which vertical portions of the capacitor contribute significantly to the total charge storage capacity. In such designs, the side of the capacitor connected to the transistor is generally called the "storage node" or "storage poly" since the material out of which is it formed is doped polysilicon, while the polysilicon layer defining the side of the capacitor connected to the reference voltage mentioned above is called the "cell poly."

One method used for increasing the surface area of a capacitor involves forming rough or irregular storage node or electrode surfaces. Commonly owned U.S. Pat. Nos. 5,494,841, 5,407,534, 5,340,765, 5,340,763, 5,338,700, hereby incorporated herein by reference, each teach forming a rough surface on the capacitor storage node by depositing a hemispherical grain polysilicon on the capacitor storage node, then blanket etching the hemispherical grain polysilicon (or similar technique), which forms a roughened layer of polysilicon that increases the overall surface area in a given unit area over a normally smooth surface. With the increased surface area caused by the roughened surface, a higher storage capacitance can be achieved.

Another method of increasing the capacitance capability of a capacitor is through the use of high dielectric constant materials. The "dielectric constant" is a value characteristic of a material which is proportional to the amount of charge that can be stored in the material when it is interposed between two electrodes. HDC materials generally have dielectric constant values greater than 50 at the normal semiconductor device operating temperatures. High dielectric constant materials which can be used in capacitor fabrication include perovskite, $Ba_xSr_{(z-x)}TiO_3$["BST"], $Sr_{(z-x)}TiO_3$["ST"], $BaTiO_3$, $SrTiO_3$, $PbTiO_3$, $Pb(Zr,Ti)O_3$ ["PZT"], $(Pb,La,Zr,Ti)O_3$["PLZT"], $(Pb,La)TiO_3$["PLT"], $KNO_3$, and $LiNbO_3$. Unfortunately, most high dielectric constant materials are incompatible with existing processes and cannot be simply deposited on a polysilicon electrode as are presently utilized dielectric materials, such as $Si_3N_4$, $SiO_2$, and $Si_3N_4/SiO_2$ composite layers. The incompatibility is a result of the $O_2$-rich ambient atmosphere present during high dielectric constant material deposition or during annealing steps. The $O_2$ oxidizes portions of the material used for the storage node plate. Thus, barrier layers must be used to prevent oxidation. U.S. Pat. No. 5,381,302, issued Jan. 10, 1995 to Sandhu et al., teaches methods for fabricating capacitors compatible with high dielectric constant materials wherein a storage node electrode is provided with a barrier layer, such as titanium nitride, which prohibits diffusion of atoms.

Various metals and metallic compounds, and typically noble metals, such as platinum ("Pt"), and conductive oxides, such as ruthenium dioxide ("$RuO_2$"), have been proposed as the electrodes for use with HDC materials. However, there are several problems with the materials in standard thin film applications. For example, platinum, which is unreactive with respect to the HDC material, is difficult to use as an electrode, because platinum generally allows oxygen to diffuse through it, which renders neighboring materials susceptible to oxidization. Additionally, platinum also does not normally stick very well to traditional dielectrics, such as silicon dioxide or silicon nitride, and platinum can rapidly transform into platinum silicide at low temperatures. Thus, a tantalum or a titanium nitride layer has been suggested as an adhesion layer under the platinum electrode. However, during the deposition or annealing of the HDC material, oxygen can diffuse through the platinum and oxidize the adhesion layer and make the adhesion layer less conductive. Further, the substrate, such as a silicon-containing material, can become undesirably oxidized during the deposition of the HDC material when a platinum electrode is used.

Conductive oxides, such as ruthenium dioxide, may also exhibit problems in standard thin film structures. For example, the electrical properties of the structures formed using these oxides are usually inferior to those formed using platinum. Many thin film applications require small leakage current density in addition to a large capacitance per unit area. The leakage current is sensitive to many variables such as thickness, structure, electrode geometry, and material composition. For example, the leakage current of the HDC material, lead zirconium titanate (PZT), using ruthenium dioxide electrodes is several orders of magnitude larger than the leakage current of PZT using platinum electrodes.

U.S. Pat. No. 5,696,018, entitled Method of Forming Conductive Noble Metal Insulator Alloy Barrier Layer for High Dielectric Constant Material Electrodes, issued Dec. 9, 1997 to Summerfelt et al. ("the '018 patent"), discloses a barrier layer in conjunction with an HDC material electrode. The '018 patent discloses the use of a noble metal insulator alloy barrier to inhibit diffusion of oxygen to an underlying oxidizable layer during the formation of the HDC layer.

Therefore, it would be advantageous to develop improved methods and apparatus of a HDC capacitor having the properties of high surface area and which prevents oxidization of the material used for the storage node plate, while using inexpensive, commercially available, widely practiced semiconductor device fabrication techniques and equipment without requiring complex processing steps.

BRIEF SUMMARY OF THE INVENTION

The present invention relates to a method of forming a high surface area capacitor, such as is generally used in DRAMs. According to one embodiment of the present invention, a high surface area capacitor comprises a double metal layer, comprising an electrode metal and barrier material, deposited on hemispherical grain silicon, wherein a HDC material is deposited over the double metal layer. The high surface area capacitor is complete with an upper cell plate electrode deposited over the HDC material.

The double metal layer preferably comprises a noble metal, such as platinum or palladium, for the electrode metal and an oxidizable metal, such as ruthenium, iridium, or molybdenum, for the barrier metal. Most preferably, the metal combination for the double metal layer electrode is selected from the pairs of platinum/ruthenium, platinum/iridium, platinum/molybdenum, palladium/ruthenium, and palladium/molybdenum. The noble metal, such as platinum metal, alone would normally allow oxygen to diffuse into and oxidize any adhesion layer (making the adhesion layer less conductive) and/or undesirably oxidize any silicon-containing material during the deposition of the HDC material. Thus, the barrier metal is used to form a conducting oxide layer or other conductive layer which substantially stops the oxygen diffusion.

HSG silicon provides an enhanced surface roughness that boosts cell capacitance. The HDC material, preferably BST or the like, is also used to boost cell capacitance. There are several advantages to using the combination of HSG silicon with a high dielectric constant material such as BST. First, the use of HSG silicon effectively doubles the capacitance value for a given area. Second, HDC materials, such as BST, have K constant values about twice that of commonly used dielectrics, such as tantalum oxide. Thus, the combination of HSG silicon with HDC materials results in about a four-fold increase in capacitance over a capacitor utilizing the same surface area with HDC material. For example, even at a reduced size, BST has the same leakage current limitations as tantalum oxide. Thus, in a 0.25 square micron area, BST on HSG silicon provides the same capacitance level as tantalum oxide alone in a 1 square micron area. This allows a tremendous reduction in the overall area of the capacitor cell without sacrificing capacitance.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

FIGS. 1–13 illustrate a technique for forming a high dielectric constant cell capacitor for a memory cell. It should be understood that the figures presented in conjunction with this description are not meant to be illustrative of actual cross-sectional views of any particular portion of an actual semiconductor device, but are merely idealized representations which are employed to more clearly and fully depict a process of the invention than would otherwise be possible.

Figure 1:
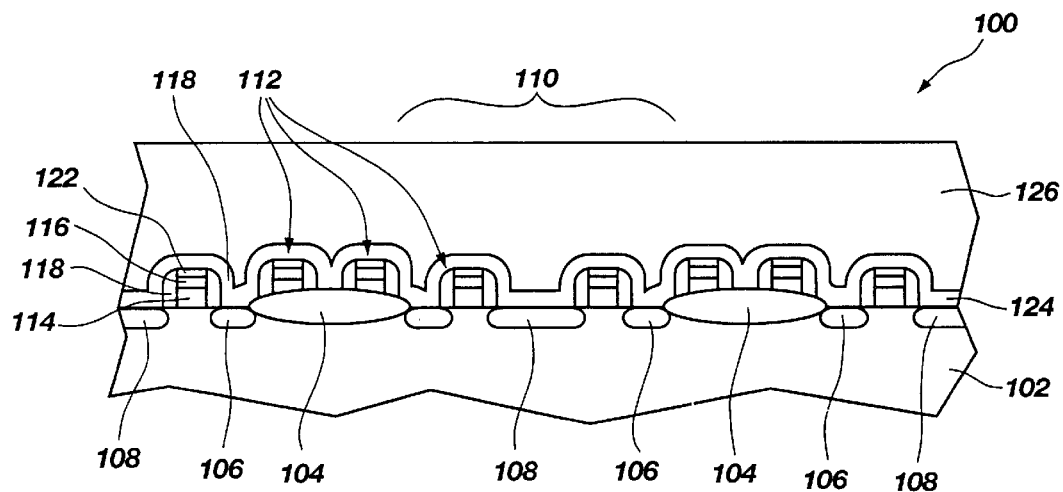
FIGS. 1–13 are side cross-sectional views of a method of forming a memory cell capacitor according to the present invention.

FIG. 1 illustrates a cross-sectional view of an in-process intermediate structure 100 in the production of a memory cell array (i.e., a DRAM). This intermediate structure 100 comprises a substrate 102, such as a lightly doped P-type crystal silicon substrate, which has been oxidized to form thick field oxide areas 104 and exposed to implantation processes to form drain regions 106 and source regions 108 of N+ doping. Transistor gate members 112 are formed on the surface of the substrate 102, including gate members 112 residing on a substrate active area 110 spanned between the drain regions 106 and the source regions 108 and gate members 112 residing on the thick field oxide areas 104. The transistor gate members 112 each comprise a lower buffer layer 114, preferably made of silicon dioxide, separating a gate conducting layer or wordline 116 of the transistor gate member 112 from the substrate 102. Transistor insulating spacer members 118, preferably made of silicon nitride, are formed on either side of each transistor gate member 112. A cap insulator 122, also preferably made of silicon nitride, is formed on the top of each transistor gate member 112. A first barrier layer 124 (preferably made of tetraethyl orthosilicate—TEOS or the like) is applied over the transistor gate members 112 and the substrate 102. A second barrier layer 126 (preferably made of borophosphosilicate glass—BPSG, phosphosilicate glass—PSG, borosilicate glass—BSG, or the like) is deposited over the first barrier layer 124. The second barrier layer 126 may be optionally planarized, if necessary, preferably using an abrasive process, such as chemical mechanical planarization (CMP).

It is, of course, understood that a single barrier layer could be employed. However, a typical barrier configuration is a layer of TEOS over the transistor gate members 112 and the substrate 102 followed by a BPSG layer over the TEOS layer. The TEOS layer is applied to prevent dopant migration. The BPSG layer contains boron and phosphorus which can migrate into the source and drain regions formed on the substrate during inherent device fabrication heating steps. This migration of boron and phosphorus can change the dopant concentrations in the source and drain regions which can adversely affect the transistor performance.

Figure 2:
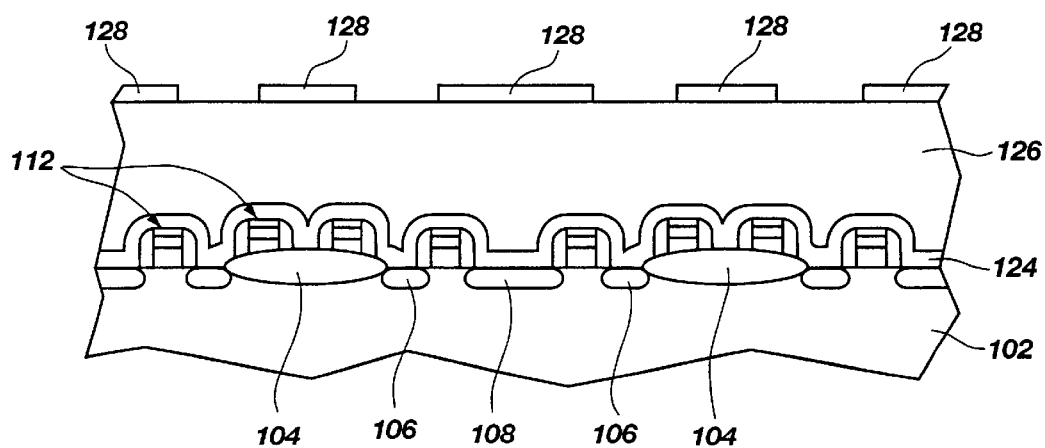
Figure 3:
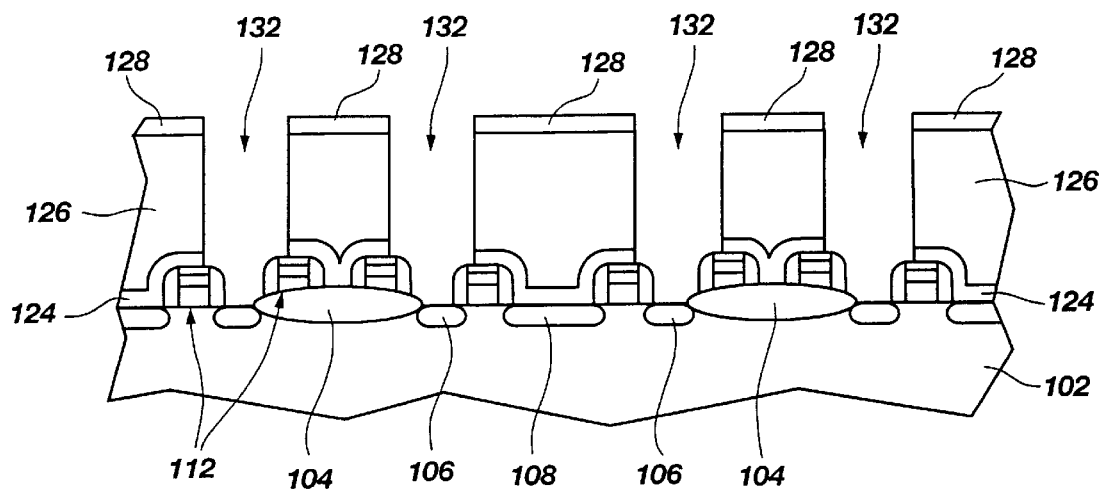
Figure 4:
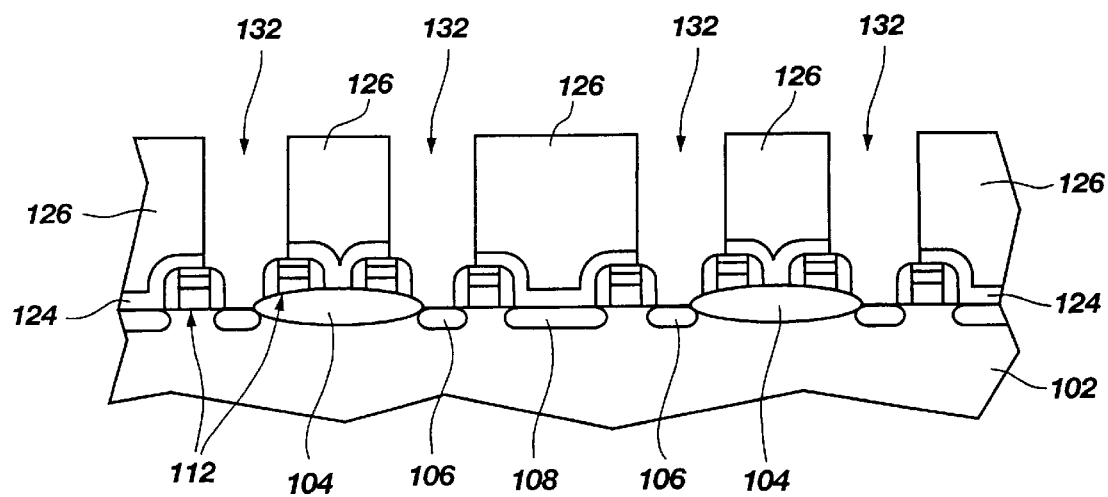
Figure 5:
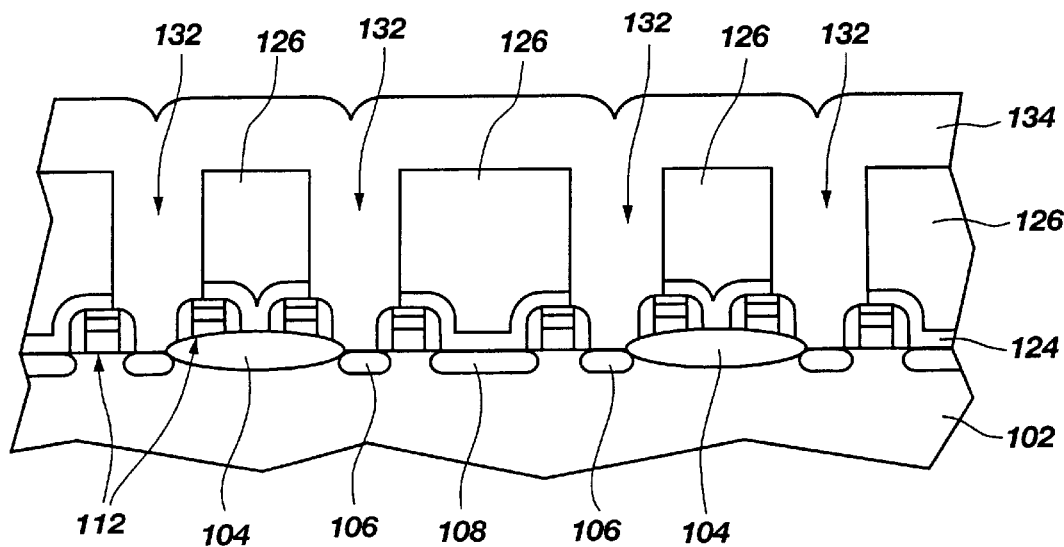
Figure 6:
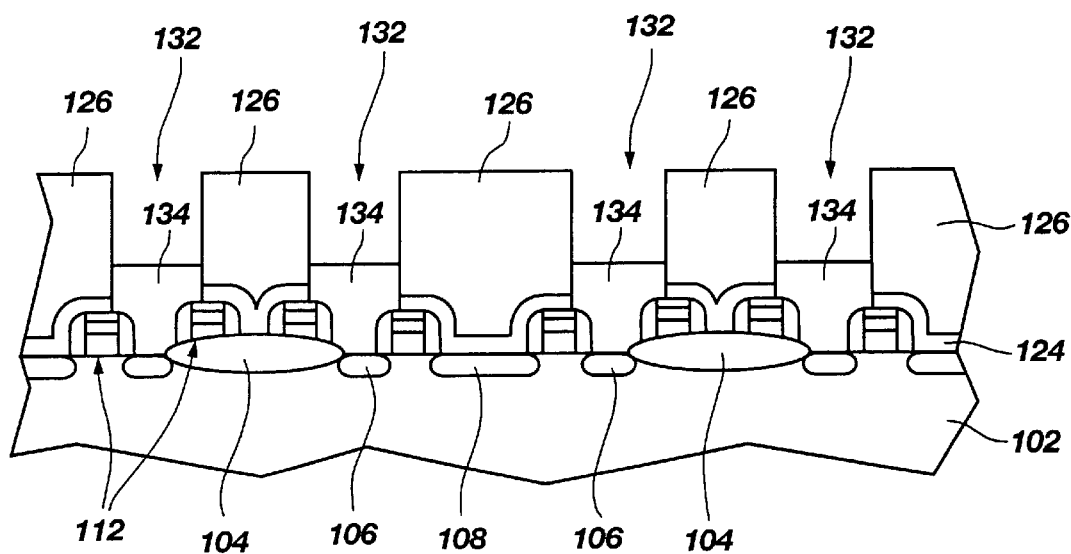

A first resist layer 128 is patterned, as shown in FIG. 2, and the second barrier layer 126 and the first barrier layer 124 are etched to expose the drain regions 106 in the substrate 102 forming vias 132, as shown in FIG. 3. Any remaining first resist layer 128 is then stripped, as shown in FIG. 4, and a layer of conductive polysilicon material 134 is applied over the structure to fill the vias 132, as shown in FIG. 5. The conductive polysilicon material 134 is etched such that it is recessed within the vias 132, as shown in FIG. 6. This may be achieved with CMP, wet etch, dry etch, or a combination thereof.

Figure 7:
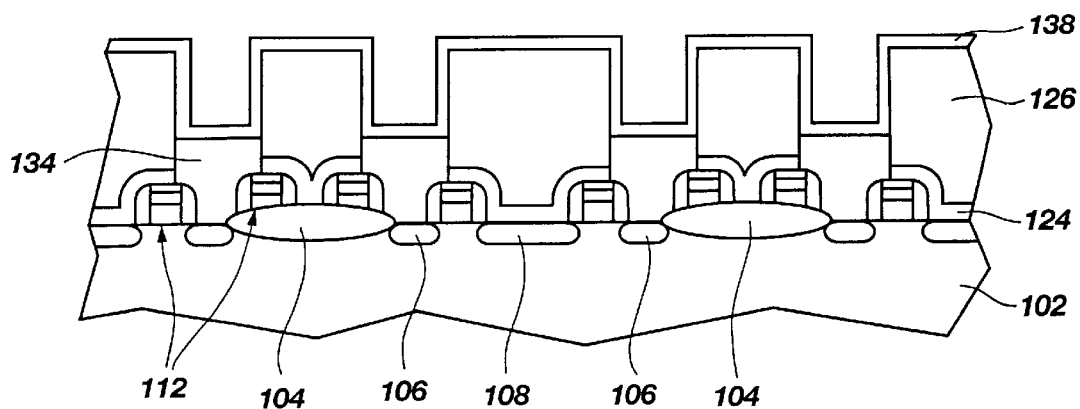
Figure 8:
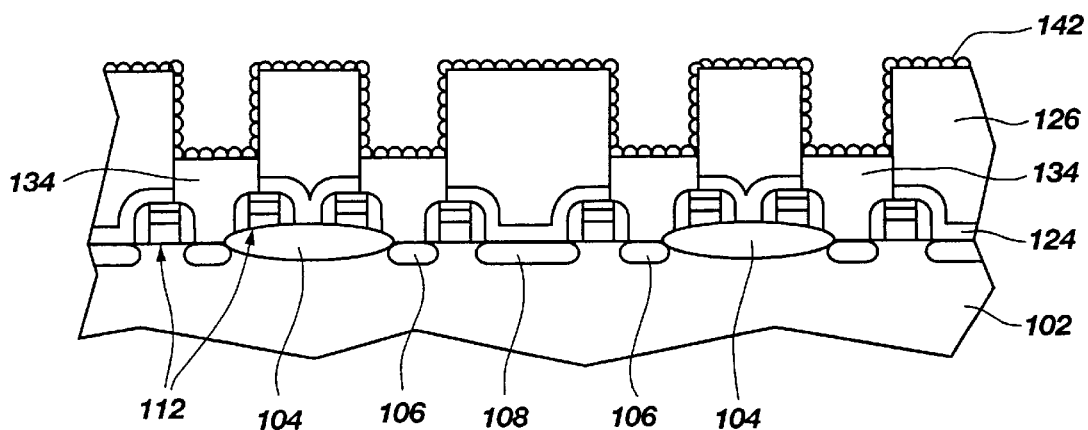

An HSG polysilicon layer is formed by applying a layer of amorphous silicon 138 over the layer of conductive polysilicon material 134 and over the exposed second barrier layer 126, as shown in FIG. 7. A polysilicon seed crystal layer is applied at a temperature of at least 500° C., preferably between about 550 and 600° C., and a pressure of between about $10^{-7}$ and $10^{-2}$ Torr. The polysilicon seed crystal layer is then annealed at a temperature of at least 500° C., preferably between about 550 and 700° C., and a pressure between about $10^{-7}$ and $10^{-2}$ Torr. The annealing causes the amorphous silicon to nucleate into a polysilicon material around the polysilicon seed crystal to form the HSG polysilicon layer 142, as shown in FIG. 8. An optional etch step may be performed at this point to further roughen the HSG polysilicon layer 142.

Figure 9:
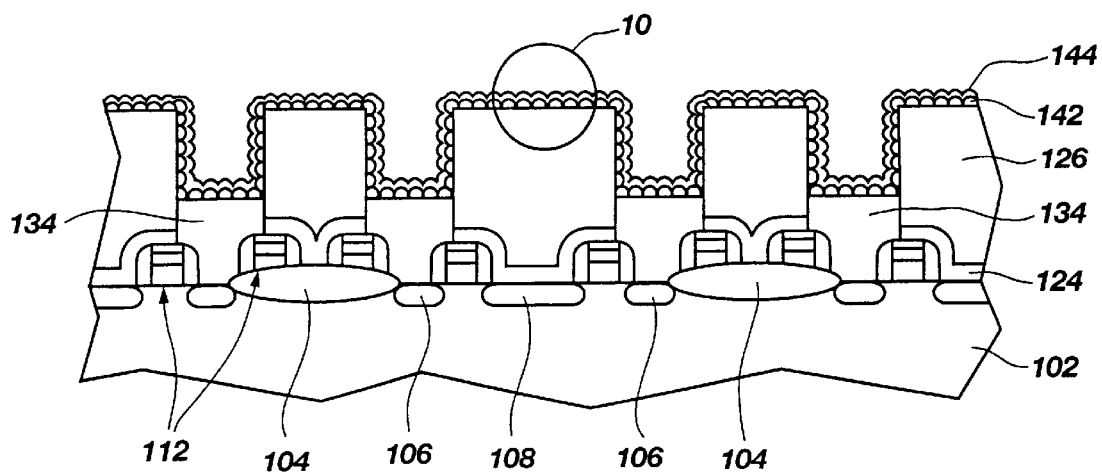
Figure 10:
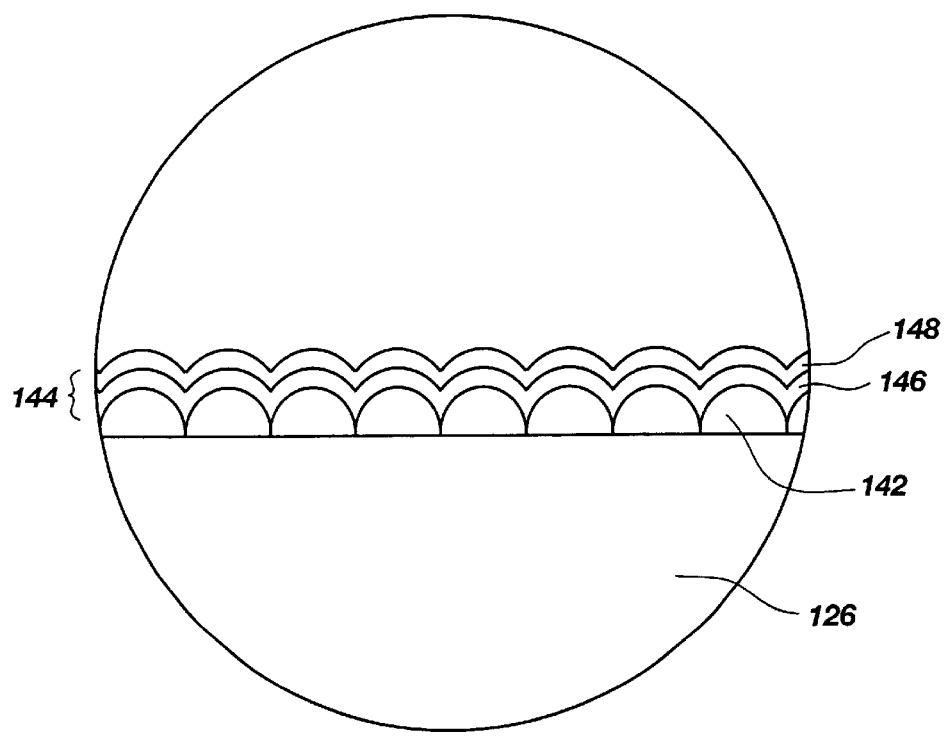

A double metal layer 144 is deposited over the HSG polysilicon layer 142, as shown in FIG. 9. As shown in FIG. 10 (inset 10 of FIG. 9), the double metal layer 144 comprises a barrier metal layer 146 deposited over the HSG polysilicon layer 142 and an electrode metal layer 148, preferably platinum or palladium, deposited over the barrier metal layer 146. The barrier metal layer 146 is preferably deposited to a depth of between 40 and 300 Å and is an oxidizable metal which is conductive after oxidation and provides a barrier to oxygen diffusion after oxidation, such as ruthenium (oxidizes to ruthenium dioxide ($RuO_2$)), iridium (oxidizes to iridium dioxide ($IrO_2$)), molybdenum (oxidizes to molybdenum dioxide ($MoO_2$)), rhodium (oxidizes to rhodium dioxide ($RhO_2$)), or platinum (oxidizes to platinum dioxide ($PtO_2$)). The barrier metal layer 146 may also be a material which is conductive after thermal degradation to provide a barrier to oxygen diffusion, such as tungsten nitride ($WN_x$ (x=1 to 4)) which degrades to a tungsten barrier layer. The barrier metal layer 146 may be partially or completely converted to its oxide or degraded form either during or after deposition, or during a subsequent processing step.

Additionally, a platinum layer may be used as the barrier metal layer 146, so long as the platinum is oxidized into platinum dioxide prior to the subsequent deposition of an HDC layer.

The electrode metal layer 148, preferably platinum, rhodium, ruthenium, or palladium, is deposited over the barrier metal layer 146 to a depth of between about 40 and 300 Å. The electrode metal layer 148 is preferably deposited by chemical vapor deposition or metal-organic chemical vapor deposition, as known in the art. The electrode metal layer 148 may also be deposited using e-beam evaporation or DC sputter deposition in an argon atmosphere at a pressure of approximately 5 millitorr using a target of the selected electrode metal material with the temperature of the substrate 102 held at about 325° C. When platinum is used as the electrode metal layer 148, it is preferable to perform the deposition at a temperature of between about 300 and 600° C., as the micro-structure in thermal stress of the platinum layer is generally improved at such a temperature range.

Figure 11:
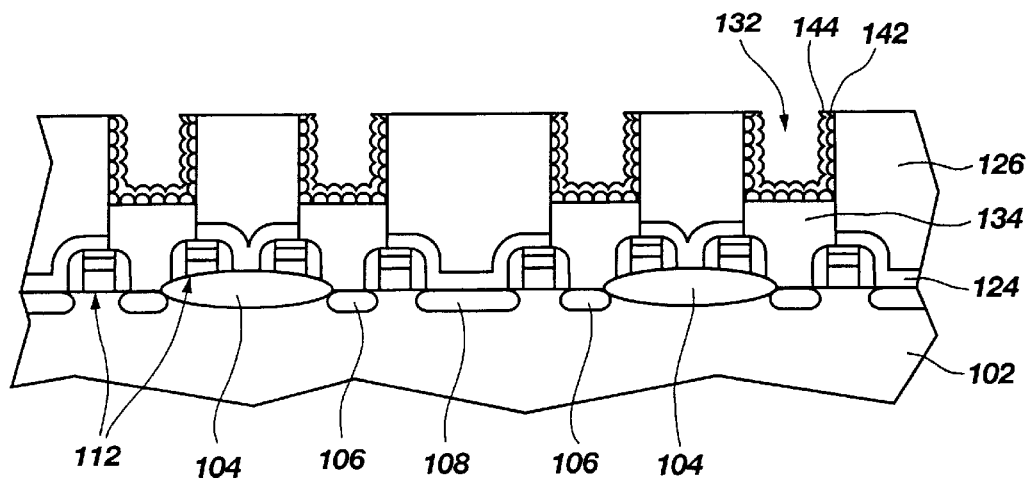

The double metal layer 144 is etched or abraded such that the polysilicon material layer 134 within each via 132 is electrically isolated from one another, as shown in FIG. 11. The double metal layer 144 may be preferably etched by dry etch in a low-pressure, high-density plasma RIE reactor or may be abraded with a chemical mechanical planarization technique, as known in the art.

Generally, the oxidation rate of barrier metal layer 146 is generally much more rapid at the beginning of the HDC material deposition process than later. Thus, it is usually beneficial to perform partial oxidation in order to let the barrier metal layer 146 oxidize to less strenuous oxidizing conditions before HDC material deposition. For example, if the metal-organic chemical vapor deposition (MOCVD) of the HDC material occurs at about 650° C. in an oxygen-containing atmosphere at a pressure of about 1 torr for about 3 minutes, then the barrier metal layer 146 should be annealed at about 600° C. in an oxygen-containing atmosphere at a pressure of about 1 torr for about 20 minutes before HDC material deposition. The lower temperature generally has some advantage in that it slows down the oxidation rate of the barrier metal layer 146 and allows double metal layer 144 more time to "relax" than if the oxidation is performed at full deposition temperature. Another benefit of this oxidation anneal process is that the electrode metal layer 148 can rearrange to further round any corners after being etched or abraded, which helps to dampen or eliminate intense, structure damaging electric fields which can be generated at sharp edge surfaces of the electrode metal layer 148 during the operation of the capacitor.

Figure 12:
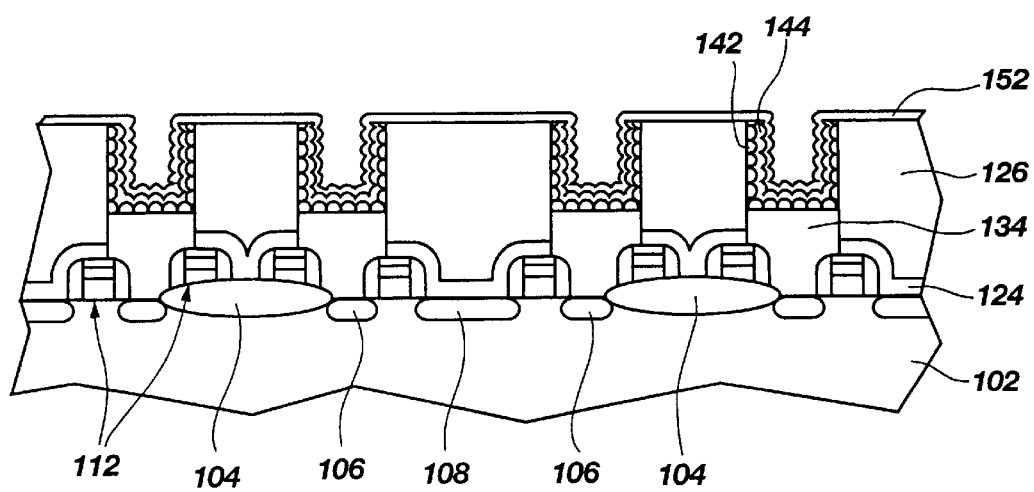

An HDC material layer 152, preferably BST or ST, is deposited over the double metal layer 144 and exposed portions of the second barrier layer 126, preferably by a MOCVD technique, as shown in FIG. 12. As previously mentioned, the deposition of the HDC material layer 152 generally requires conditions highly conducive to oxidation; however, the electrode metal layer 148 will remain unoxidized and barrier metal layer 146 (see FIG. 10) will substantially inhibit oxygen from diffusing into underlying materials, such as the conductive polysilicon material 134.

If the HDC material layer 152 used is barium strontium titanate, the HDC material layer 152 will be of a thickness ranging from 200 to 350 angstroms. Preferably, the entire film stack of the barrier metal layer 146, the electrode metal layer 148, and the HDC material layer 152 will have a thickness not exceeding 1,000 angstroms. The thin layer of barrier metal layer 146 and the electrode metal layer 148 are designed to preserve the advantages of the rough texture of the HSG polysilicon layer 142 therebelow, as it is advantageous to keep the HDC material layer 152 as close to the rough texture of the HSG polysilicon layer 142 as possible.

Figure 13:
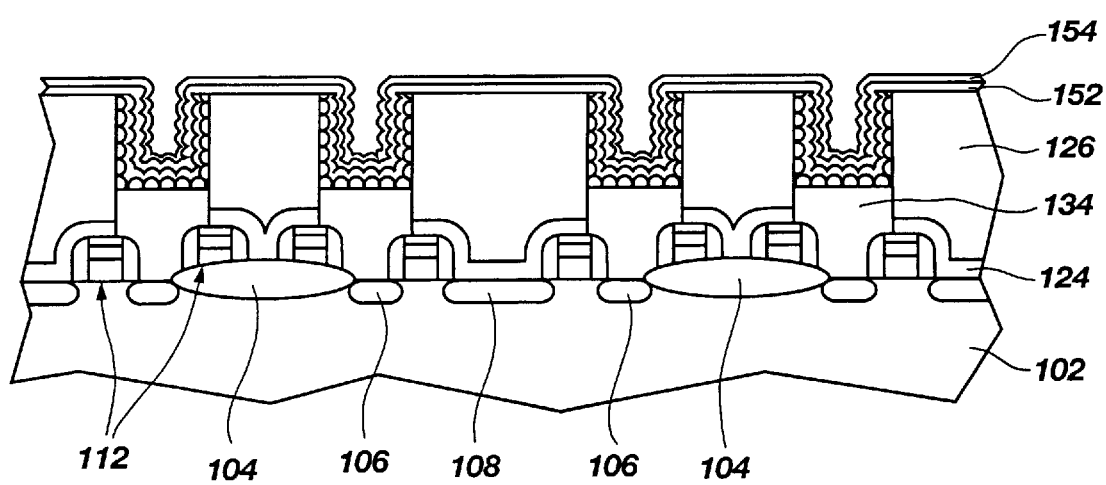

The capacitors are completed by depositing an upper cell plate electrode 154, preferably platinum, over the HDC material layer 152, as shown in FIG. 13. After subsequent processing steps, the capacitor structures may be annealed to improve the capacitor properties. However, since the present invention is a HSG capacitor having the previously described roughened layer of polysilicon, the annealing should be limited so that the HSG roughened layer characteristic is not destroyed.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of forming a semiconductor capacitor, comprising:

providing a layer of hemispherical-grain silicon;

forming a layer of substantially oxygen-impervious material on said layer of hemispherical-grain silicon;

disposing a layer of electrode metal on said substantially oxygen-impervious material layer; and disposing a layer of high dielectric constant material on said electrode metal layer.

2. The method of claim 1, further comprising disposing a cell plate electrode on said high dielectric constant material layer.

3. The method of claim 1, wherein said disposing said substantially oxygen-impervious material layer includes disposing a substantially oxygen-impervious, conductive material layer on said hemispherical-grain silicon layer.

4. The method of claim 1, wherein said forming said substantially oxygen-impervious material layer comprises:

disposing a metal on said hemispherical-grain silicon layer selected from the group consisting of ruthenium, iridium, molybdenum, rhodium, and platinum; and oxidizing said selected metal.

5. The method of claim 1, wherein said forming said substantially oxygen-impervious material layer comprises:

disposing a thermally degradable metal compound on said hemispherical-grain silicon layer; and thermally degrading said thermally degradable metal compound.

6. The method of claim 5, wherein said disposing said thermally degradable metal compound includes disposing tungsten nitride on said hemispherical-grain silicon layer.

7. The method of claim 1, wherein said disposing said electrode metal layer includes disposing a noble metal on said substantially oxygen-impervious material.

8. The method of claim 1, wherein said disposing said electrode metal layer comprises disposing a metal selected from the group of metals consisting of platinum, ruthenium, rhodium, and palladium.

9. The method of claim 1, wherein said disposing said high dielectric constant material layer comprises disposing a material selected from the group consisting of BST, ST, PZT, PLZT, PLT, $BaTiO_3$, $SrTiO_3$, $PbTiO_3$, $KNO_3$, and $LiNbO_3$.

* * * * *

UNITED STATES PATENT AND TRADEMARK OFFICE
CERTIFICATE OF CORRECTION

PATENT NO.   : 6,399,459 B2
DATED        : June 4, 2002
INVENTOR(S)  : Husam N. Al-Shareef, Scott DeBoer and Randhir Thakur It is certified that error appears in the above-identified patent and that said Letters Patent is hereby corrected as shown below:

Drawings,
FIGURE 1, change the lead line of the upper occurrence of "118" to better indicate correct position of the spacer member as shown below:

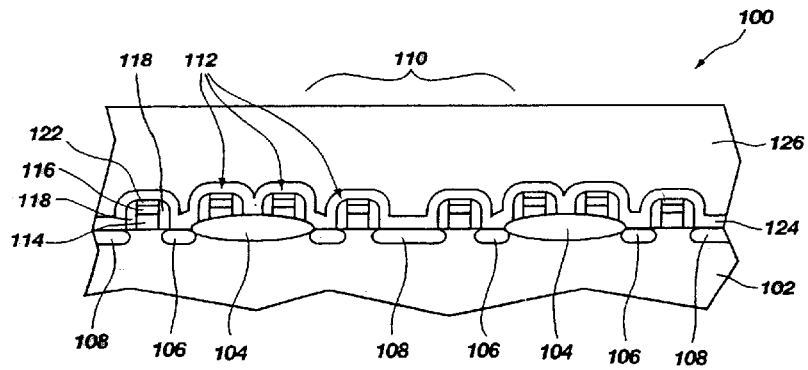

Fig. 1

Column 2,
Line 14, change "is it" to -- it is --

Signed and Sealed this

Sixth Day of January, 2004

JAMES E. ROGAN
*Director of the United States Patent and Trademark Office*